(12) United States Patent
Mendenhall

(10) Patent No.: US 9,973,158 B1
(45) Date of Patent: May 15, 2018

(54) POWER SUPPLY FOR CLASS D AMPLIFIER IN ENERGY EFFICIENT APPLICATIONS

(71) Applicant: RGB Systems, Inc., Anaheim, CA (US)

(72) Inventor: Eric Mendenhall, Laguna Beach, CA (US)

(73) Assignee: RGB Systems, Inc., Anaheim, CA (US)

( * ) Notice: Subject to any disclaimer, the term of this patent is extended or adjusted under 35 U.S.C. 154(b) by 0 days. days.

(21) Appl. No.: 15/339,307

(22) Filed: Oct. 31, 2016

(51) Int. Cl.
| | |
|---|---|
| H03F 3/21 | (2006.01) |
| H03F 3/185 | (2006.01) |
| H02M 1/42 | (2007.01) |
| H02M 3/335 | (2006.01) |
| H03F 3/217 | (2006.01) |
| H03K 17/687 | (2006.01) |

(52) U.S. Cl.
CPC ............ H03F 3/2173 (2013.01); H02M 1/42 (2013.01); H02M 3/33592 (2013.01); H03F 3/185 (2013.01); H03K 17/687 (2013.01); H03F 2200/541 (2013.01)

(58) Field of Classification Search
USPC ........................ 330/10, 207 A, 251, 296–297
See application file for complete search history.

(56) References Cited

U.S. PATENT DOCUMENTS

| | | | |
|---|---|---|---|
| 6,169,681 B1 * | 1/2001 | Kemp | H02M 3/337 363/134 |
| 6,611,169 B2 | 8/2003 | Mendenhall | |
| 7,839,215 B2 | 11/2010 | Mendenhall | |
| 9,571,084 B1 * | 2/2017 | Vinciarelli | |

* cited by examiner

*Primary Examiner* — Hieu Nguyen
(74) *Attorney, Agent, or Firm* — Knobbe Martens Olson & Bear LLP

(57) ABSTRACT

A power supply for use with Class D amplifiers in energy efficient applications is described herein. The power supply reduces the effects of off side charging and improves cross regulation. The topology of the power supply can be designed to minimize quiescent mode losses through resonant switching of some or all active switches. Additionally, the power supply can be implemented without external resonant inductors, the power supply can be implemented with smaller capacitors that have longer lifetime ratings, the switching losses present in a power factor correction stage of the power supply can be reduced, and/or a modified power factor correction choke can be utilized to reduce energy loss.

18 Claims, 14 Drawing Sheets

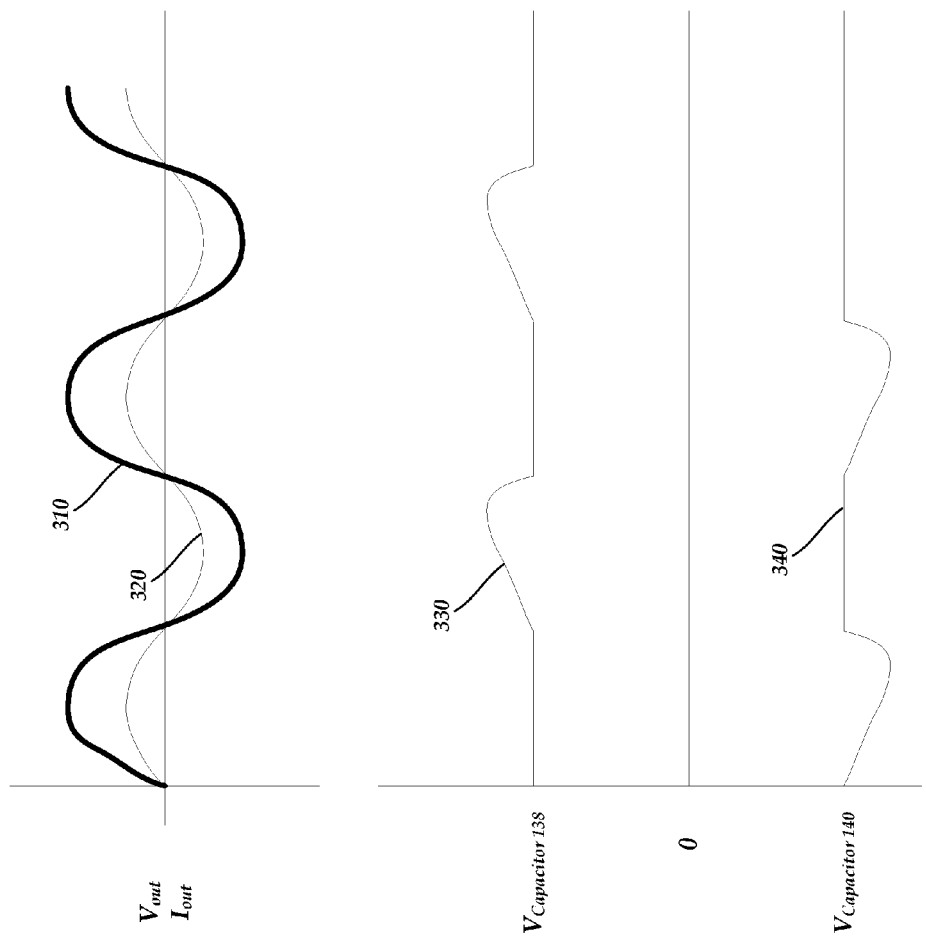

POWER SUPPLY FOR CLASS D AMPLIFIER IN ENERGY EFFICIENT APPLICATIONS

TECHNICAL FIELD

The present disclosure relates generally to electronics for a power supply for an amplifier.

BACKGROUND

High quality audio power amplifiers are traditionally large, heavy, and inefficient. Typically, these audio power amplifiers are capable of high power audio output with low total harmonic distortion. However, the traditional audio power amplifiers may achieve only approximately 25% efficiency under normal audio operating conditions because such audio power amplifiers generally use inefficient linear or quasi-linear amplifiers (e.g., Class A, B, G, and/or H amplifiers).

Recently, the demand for more efficient audio power amplifiers has increased. Thus, audio power amplifiers have started to include Class D amplifiers. Class D amplifiers allow audio power amplifiers to achieve higher efficiency than traditional audio power amplifiers because switches in the Class D amplifiers are not operated in the linear region. However, power supplies that provide power to Class D amplifiers can suffer from problems of off side charging and cross regulation of bipolar outputs.

SUMMARY

The systems, methods, and devices described herein each have several aspects, no single one of which is solely responsible for its desirable attributes. Without limiting the scope of this disclosure, several non-limiting features will now be discussed briefly.

As described above, Class D amplifiers can suffer from problems of off side charging and poor cross regulation of bipolar outputs. Accordingly, a power supply for use with Class D amplifiers in energy efficient applications is described herein that reduces the effects of off side charging and improves cross regulation. The topology of the power supply can be designed to minimize quiescent mode losses through resonant switching of some or all active switches. Additionally, the power supply can be implemented without external resonant inductors, the power supply can be implemented with smaller capacitors that have longer lifetime ratings, the switching losses present in a power factor correction stage of the power supply can be reduced, and/or a modified power factor correction choke can be utilized to reduce energy loss.

One aspect of the disclosure provides an apparatus comprising: a positive output; a negative output; a first transformer; a second transformer comprising a primary side and a secondary side; a first set of transistors coupled to the primary side of the second transformer, where the first transformer is configured to drive the first set of transistors; a first set of synchronous rectifiers coupled to the secondary side of the second transformer, where the first set of synchronous rectifiers are further coupled to the positive output, and where the first transformer is further configured to drive the first set of synchronous rectifiers; and a second set of synchronous rectifiers coupled to the secondary side of the second transformer, where the second set of synchronous rectifiers are further coupled to the negative output and the first set of synchronous rectifiers, and where the first transformer is further configured to drive the second set of synchronous rectifiers.

The apparatus of the preceding paragraph can include any sub-combination of the following features: where the first transformer comprises a second primary side and a second secondary side, where the second primary side comprises a second set of transistors and a first inductor coupled to the second set of transistors, and where the first inductor produces a magnetized inductance; where the second secondary side comprises a first set of inductors, a second set of inductors, and a third set of inductors, where the first set of inductors are coupled to the first set of transistors, where the second set of inductors are coupled to the first set of synchronous rectifiers, and where the third set of inductors are coupled to the second set of synchronous rectifiers; where the primary side of the second transformer comprises an inductor that produces a magnetized inductance; where the first set of synchronous rectifiers are configured to reduce an off side charging of a supply voltage rail corresponding to the positive output from a first level to a second level lower than the first level; where the second set of synchronous rectifiers are configured to reduce an off side charging of a supply voltage rail corresponding to the negative output from a first level to a second level lower than the first level; where the first set of synchronous rectifiers comprises a first synchronous rectifier and a second synchronous rectifier, where a drain of the first synchronous rectifier and a drain of the second synchronous rectifier are coupled to the positive output; where the second set of synchronous rectifiers comprises a third synchronous rectifier and a fourth synchronous rectifier, where a source of the third synchronous rectifier and a source of the fourth synchronous rectifier are coupled to the negative output, where a drain of the third synchronous rectifier is coupled to a source of the first synchronous rectifier, and where a drain of the fourth synchronous rectifier is coupled to a source of the second synchronous rectifier; where the apparatus further comprises a power factor correction (PFC) controls circuit, and a PFC stage coupled to the PFC controls circuit, where the PFC stage is further coupled to the first set of transistors; where the PFC controls circuit comprises a current source configured to generate a current and a second current source configured to reduce an amplitude of the current generated by the current source to reduce a period of time during which a transistor in the PFC stage is switching between a first voltage and a second voltage; where the PFC stage comprises a PFC choke, where the PFC choke comprises a core with a first portion and a second portion separated from the first portion by a gap; where the core comprises a ferrite toroid; where the apparatus comprises a power supply for a Class D amplifier; and where the apparatus is configured to reduce a quiescent power level from 12.1 W to 8.4 W.

Another aspect of the disclosure provides a method comprising: driving, by a first transformer, a first set of transistors, where a second transformer comprises a primary side and a secondary side, and where the first set of transistors is coupled to the primary side; driving, by the first transformer, a first set of synchronous rectifiers, where the first set of synchronous rectifiers is coupled to the secondary side; driving, by the first transformer, a second set of synchronous rectifiers, where the second set of synchronous rectifiers is coupled to the secondary side; generating, by the first set of synchronous rectifiers, a positive output; and generating, by the second set of synchronous rectifiers, a negative output.

The method of the preceding paragraph can include any sub-combination of the following features: where the first transformer comprises a second primary side and a second secondary side, where the second primary side comprises a second set of transistors and a first inductor coupled to the second set of transistors, and where the first inductor produces a magnetized inductance; where the second secondary side comprises a first set of inductors, a second set of inductors, and a third set of inductors, where the first set of inductors are coupled to the first set of transistors, where the second set of inductors are coupled to the first set of synchronous rectifiers, and where the third set of inductors are coupled to the second set of synchronous rectifiers; where the method further comprises reducing, by the first set of synchronous rectifiers, an off side charging of a supply voltage rail corresponding to the positive output from a first level to a second level lower than the first level; where the positive output comprises a positive output of a power supply for a Class D amplifier; and where generating a positive output and generating a negative output further comprises reducing a quiescent power level from 12.1 W to 8.4 W.

BRIEF DESCRIPTION OF THE DRAWINGS

Embodiments will now be described with reference to the drawings summarized below. These drawings and the associated description are provided to illustrate example aspects of the disclosure, and not to limit the scope of the invention.

FIG. 3 illustrates example graphs depicting the off side charging problem in the supply voltage circuit of FIG. 1A.

DETAILED DESCRIPTION OF SPECIFIC EMBODIMENTS

Figure 1A:
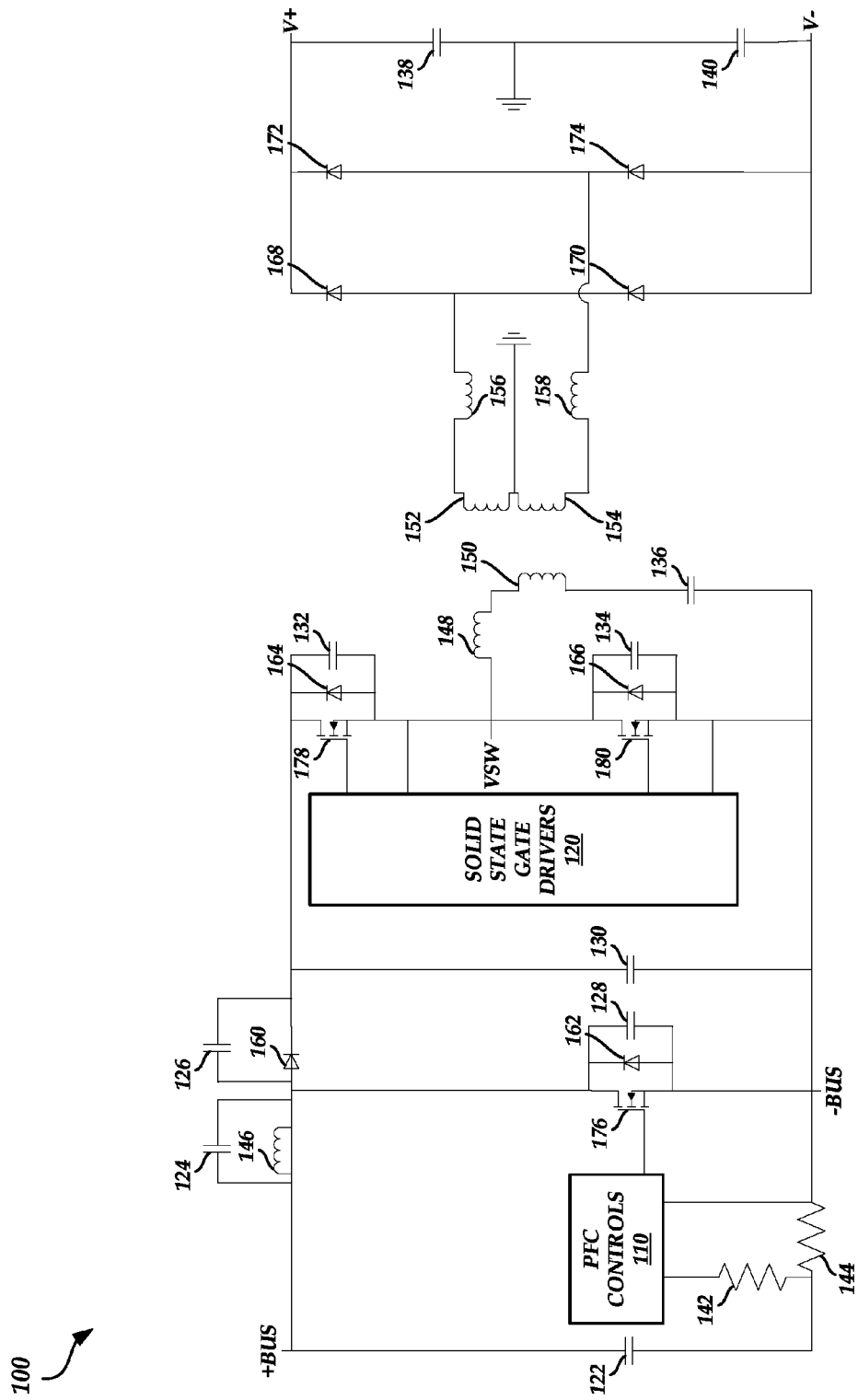
FIG. 1A illustrates an example topology of a power supply circuit.

As described above, power supplies that provide power to Class D amplifiers can suffer from problems of off side charging and poor cross regulation of bipolar outputs. For example, a conventional half bridge Class D amplifier can include a positive supply voltage rail, a negative supply voltage rail, a driver that drives the high side of the amplifier, and a driver that drives the low side of the amplifier. The half bridge Class D amplifier can cause off side charging (e.g., rail pumping) in which energy is transferred from a loaded converter output to an unloaded converter output. The loaded converter output is the portion of the power supply that supplies a first supply voltage to a first supply voltage rail from which the half bridge class D amplifier currently draws power. The unloaded converter output is the portion of the power supply that supplies a second supply voltage to a second supply voltage rail from which the half bridge class D amplifier is not intended to be currently drawing power. As an example, when the high side driver is active, power is provided from a power supply to the positive supply voltage rail. During such time, a first portion of the power supply circuit that provides the positive supply voltage is considered the loaded converter output, and a second portion of the power supply circuit that provides the negative supply voltage is considered the unloaded converter output. As another example, when the low side driver is active, power is provided from a power supply to the negative supply voltage rail. During such time, the second portion of the power supply circuit that provides the negative supply voltage is considered the loaded converter output, and the first portion of the power supply circuit that provides the positive supply voltage is considered the unloaded converter output.

The off side charging condition occurs in conventional half bridge class D amplifiers because the load of the half bridge class D amplifier is coupled between the loaded converter output and ground and a filter capacitor of the unloaded converter output is coupled between the corresponding unloaded supply voltage rail and ground. Off side charging can cause the magnitude of the unloaded supply voltage to increase (e.g., because current may be fed into the unloaded supply voltage rail). The unloaded supply voltage may increase to the extent that the unloaded supply voltage exceeds voltage ratings of Class D amplifier devices (e.g., as defined by ENERGY STAR or other related standards). Off side charging can also cause distortion by introducing non-linearity in the forward transfer function.

To counteract the effects of off side charging in fixed frequency power supplies, larger output capacitors can be used. For example, large output capacitors can be used on the positive and negative power supply rails. However, the required capacitance of the capacitors may not be proportional to the power output of the amplifier, but rather may be inversely proportional to the load impedance. Thus, if the Class D amplifier is a low power amplifier driving a low impedance load, a large amount of capacitance may be required compared to the relatively low power output. Accordingly, synchronous rectifiers can be introduced in the power supply to allow for lower value capacitors, as described in greater detail in U.S. Pat. No. 7,839,215, which is hereby incorporated by reference herein in its entirety.

In addition to the problems caused by off side charging, the difficulty of providing power to a half bridge Class D amplifier is further complicated by the use of a regulated power supply. A conventional regulated power supply is regulated based only on the positive supply voltage rail. In such a topology, any increase in the magnitude of the negative supply voltage rail will not enter into the feedback loop of the power supply that helps regulate the positive supply voltage. Therefore, conventional power supplies do not correct for such increases in the negative supply voltage. If the positive supply voltage rail is loaded and the negative supply voltage rail is off side charged, then the Class D amplifier may be subject to a possible overvoltage and/or nonlinearity. If the negative supply voltage rail is loaded, the negative supply voltage rail may sag all the way to zero without the feedback loop taking corrective action. In general, the magnitude of the loaded supply voltage rail may fall or sag without corrective action, referred to herein as poor cross regulation. Such lack of corrective action can cause the Class D amplifier output voltage to fall. This reduction in the Class D amplifier output voltage can cause lower power output and/or distortion of the signal being amplified. The lower power output and/or distortion can adversely affect the power rating and/or the sound quality of the Class D amplifier's output. Certain regulation schemes can be used to improve the cross regulation performance, such as the regulation schemes described in U.S. Pat. No. 6,611,169, which is hereby incorporated by reference herein in its entirety.

FIG. 1A illustrates an example topology of a power supply circuit 100. The power supply circuit 100 is a conventional power supply circuit that introduces additional challenges to overcome. As illustrated in FIG. 1A, the power supply circuit 100 includes power factor correction (PFC) controls circuit 110, a solid state gate drivers 120, capacitors 122, 124, 126, 128, 130, 132, 134, 136, 138, and 140, resistors 142 and 144, inductors 146, 148, 156, and 158, windings 150, 152, and 154, diodes 160, 162, 164, 166, 168, 170, 172, and 174, and transistors 176, 178, and 180. The winding 150 may be the primary side of a power transformer and the windings 152 and 154 may be the secondary side of the power transformer. The inductor 148 may be a resonant inductor, such as an external resonant inductor, and the capacitor 136 may be a resonant capacitor. Optionally, diodes 162, 164, and 166, capacitors 128, 132, and 134, inductors 156 and 158, and/or other components in the power supply circuit 100 represent physical characteristics of the power supply circuit 100 (e.g., resistance, capacitance, etc.) and are not actual physical components.

Figure 1B:
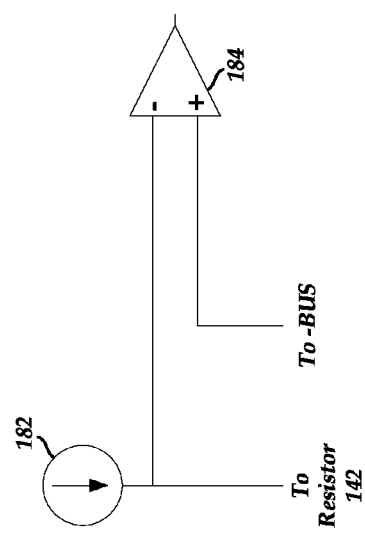
FIG. 1B illustrates an example topology of the power factor correction (PFC) controls circuit of the power supply circuit of FIG. 1A.

FIG. 1B illustrates an example topology of the PFC controls circuit 110 of the power supply circuit 100 of FIG. 1A. As illustrated in FIG. 1B, the PFC controls circuit 110 includes a current source 182 coupled to a negative input of a comparator 184 and to one end of the resistor 142. A positive input of the comparator 184 is coupled to node −BUS and one end of the resistor 144, as depicted in FIG. 1A. Optionally, the current source 182 is a rectified sine wave current source. The comparator 184 may force PFC current through the resistor 144 to reproduce the waveform produced by the current source 182. This may cause the transistor 176 to be continuously switching, as described in greater detail below.

Optionally, the power supply circuit 100 is a series resonant converter in which the transistors 178 and 180 are driven by the solid state gate drivers 120 (e.g., the solid state gate drivers 120 may include individual drivers to drive each transistor 178 and 180). The solid state gate drivers 120 may have hard switched output stages that dissipate some or all of the energy stored in the output stage transistors of the individual gate drivers and/or in the combined capacitances of the gates of the transistors 178 and 180.

The inductor 148 may be included in the power supply circuit 100 because the total leakage inductance of the primary side of the power transformer may vary with loading conditions. Optionally, the inductors 156 and 158 represent the size of the leakage inductance. Either the inductance associated with the inductor 156, the inductance associated with the inductor 158, or the inductance associated with the parallel combination of the inductors 156 and 158 can be reflected back to the primary side of the power transformer depending on the loading conditions at the output of the power supply circuit 100 (e.g., V+ and/or V−). Because the resonant frequency of the power supply circuit 100 should be approximately constant to achieve resonant switching with a fixed clock frequency, the intrinsic leakage inductance can be problematic. In some cases magnetizing inductance is used to achieve voltage regulation. However, the value of the magnetizing inductance is a function of a variable frequency regulation scheme and variable frequency operation in power supply circuits can be problematic near highly sensitive audio circuits.

Accordingly, a power supply circuit is described herein that addresses the above-described challenges. The components of the power supply circuit and the benefits of the power supply circuit are described in greater detail below with respect to FIGS. 2A-2C.

Figure 2A:
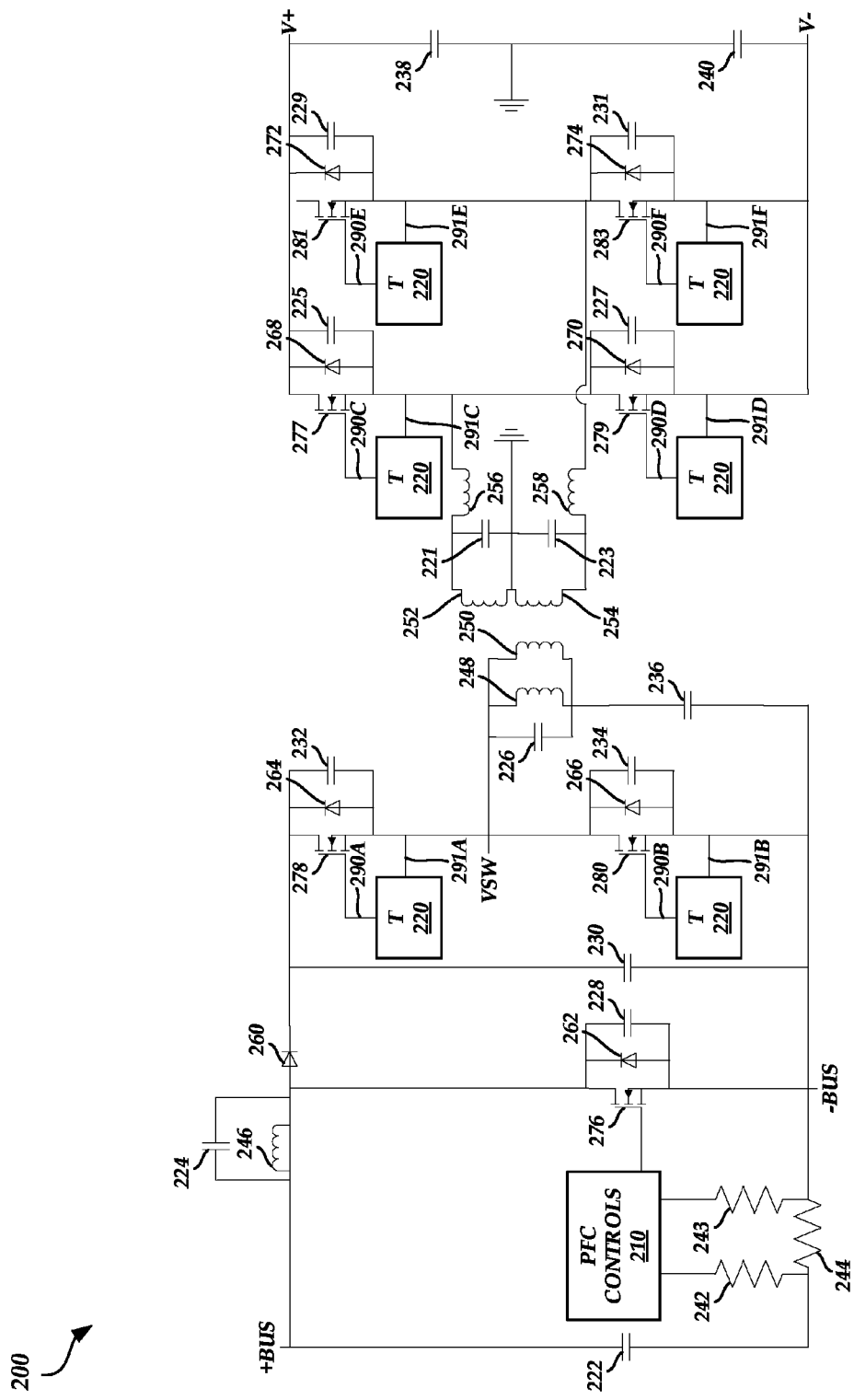
FIG. 2A illustrates an example topology of a power supply circuit for use with Class D amplifiers in energy efficient applications.

FIG. 2A illustrates an example topology of a power supply circuit 200 for use with Class D amplifiers in energy efficient applications. For example, energy efficient applications generally adhere to defined standards, such as ENERGY STAR. Such standards may require a low quiescent power (e.g., at or below 10 W), and/or high efficiency at a reduced maximum output power (e.g., at ⅛ maximum output power). In fact, normally standards require power amplifiers to enter a standby mode if no signal is received for a certain period of time. However, if the quiescent power falls below a certain threshold value (e.g., 10 W), then a power amplifier may not be required to enter the standby mode when no signal is received in order to comply with the relevant standard.

As illustrated in FIG. 2A, the power supply circuit 200 includes PFC controls circuit 210, a transformer 220, capacitors 221-232, 234, 236, 238, and 240, resistors 242-244, inductors 246, 248, 256, and 258, windings 250, 252, and 254, diodes 260, 262, 264, 266, 268, 270, 272, and 274, transistors 276, 278, and 280, and synchronous rectifiers 277, 279, 281, and 283. The winding 250 may be the primary side of a power transformer and the windings 252 and 254 may be the secondary side of the power transformer. The capacitor 236 may be a resonant capacitor. Optionally, diodes 262, 264, 266, 268, 270, 272, and 274, capacitors 225, 227-229, 231, 232, and 234, inductors 256 and 258, and/or other components in the power supply circuit 200 represent physical characteristics of the power supply circuit 200 (e.g., resistance, capacitance, etc.) and are not actual physical components.

Figure 2B:
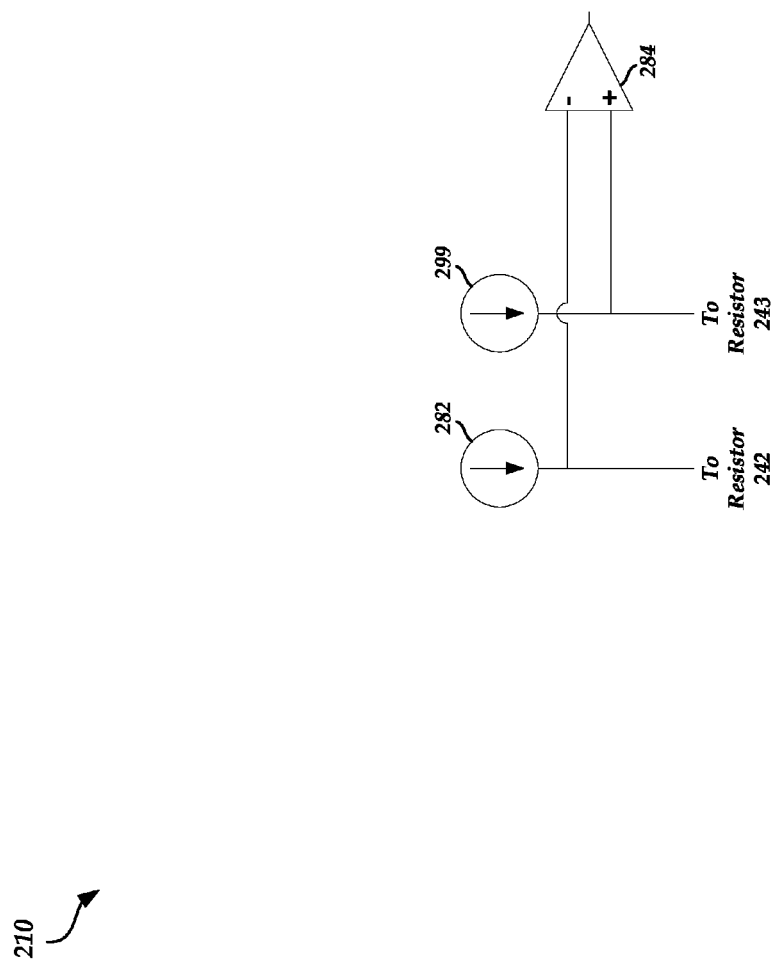
FIG. 2B illustrates an example topology of the PFC controls circuit of the power supply circuit of FIG. 2A.

FIG. 2B illustrates an example topology of the PFC controls circuit 210 of the power supply circuit 200 of FIG. 2A. As illustrated in FIG. 2B, the PFC controls circuit 210 includes a current source 282, a current source 299, and a comparator 284. The current source 282 can be coupled to a negative input of the comparator 284 and to one end of the resistor 242. The current source 299 can be coupled to a positive input of the comparator 284 and to one end of the resistor 243. Optionally, the current source 282 is a rectified sine wave current source. The current source 299 and the resistor 143 may collectively cause the sine wave current downwards so that it is negative or nearly negative near the zero crossing, as described in greater detail below.

Figure 2C:
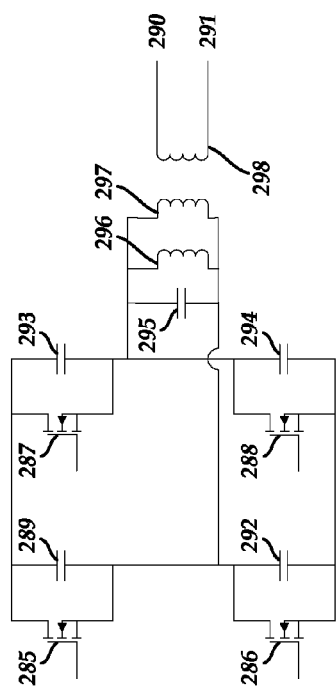
FIG. 2C illustrates an example an example topology of the transformer of the power supply circuit of FIG. 2A.

FIG. 2C illustrates an example an example topology of the transformer 220 of the power supply circuit 200 of FIG. 2A. As illustrated in FIG. 2C, the transformer 220 includes a primary side and a secondary side. The primary side includes transistors 285-288, capacitors 289 and 292-295, and inductors 296 and 297. The secondary side includes inductor 298. Optionally, capacitors 289 and 292-294 and/or other components in the transformer 220 represent physical characteristics of the transformer 220 (e.g., resistance, capacitance, etc.) and are not actual physical components.

In the illustrated optional topology, the inductors 296 and 297 and the capacitor 295 are coupled in parallel. A source of the transistor 285 can be coupled to a drain of the transistor 286 and one end of the parallel combination of the inductors 296 and 297 and the capacitor 295. A source of the transistor 287 can be coupled to a drain of the transistor 288 and the other end of the parallel combination of the inductors 296 and 297 and the capacitor 295. Furthermore, the drain of the transistor 285 and the drain of the transistor 287 can be coupled and the source of the transistor 286 and the source of the transistor 288 can be coupled.

The inductor 298 may represent six different inductors that are each coupled to one of the transistors 278 and 280 or the synchronous rectifiers 277, 279, 281, and 283 of FIG. 2A. For example, each transistor 278 and 280 and/or synchronous rectifier 277, 279, 281, and 283 may be coupled to a separate secondary side of the transformer 220. One end of an inductor is coupled to one of nodes 290A-F and the other end of the inductor is coupled one of nodes 291A-F.

The power supply circuit 200 may (1) improve cross regulation and off side charging; (2) allow for the elimination of the external resonant inductor illustrated in the power supply circuit 100; (3) use the magnetizing inductance of the transformer 220 and the power transformer (e.g., windings 250, 252, and 254) for soft switching under idle conditions; (4) reduce switching loss under quiescent conditions; and/or (5) reduce hard switching loss under quiescent conditions.

Improving Cross Regulation and Off Side Charging

In conventional power supply circuits, the values of capacitors 138 and 140 of FIG. 1A (e.g., capacitors 238 and 240 of FIG. 2A) are increased until a voltage swing is low (e.g., below a threshold value) when a voltage supply rail is loaded and/or unloaded. FIG. 3 illustrates example graphs depicting the off side charging problem in the supply voltage circuit 100 of FIG. 1A. As illustrated in FIG. 3, an amplitude 310 of the output voltage of the supply voltage circuit 100 (e.g., V+ or V−) and an amplitude 320 of the output current of the supply voltage circuit 100 oscillate. As the output voltage and the output current oscillate, amplitude 330 of the voltage across the capacitor 138 exhibits ripples. In particular, the amplitude 330 may temporarily increase when the supply voltage rail corresponding to V+ is unloaded (e.g., $V_{out}$ has a negative amplitude). Likewise, amplitude 340 of the voltage across the capacitor 140 exhibits ripples. In particular, the amplitude 330 may temporarily decrease (e.g., but increase in magnitude given that the voltage is negative) when the supply voltage rail corresponding to V− is unloaded (e.g., $V_{out}$ has a positive amplitude). Thus, the supply voltage circuit 100 experiences off side charging given the increase in magnitude of the unloaded supply voltage rail. The off side charging may cause the Class D amplifier coupled to the supply voltage circuit 100 to experience increased losses and may result in the need for higher voltage rated field-effect transistors (FETs) that have higher resistance and/or capacitance.

The off side charging may occur, at least part, based on the characteristics of the diodes 168, 170, 172, and 174. However, as illustrated in the topology of the supply voltage circuit 200, the diodes 168, 170, 172, and 174 of the supply voltage circuit 100 are replaced with synchronous rectifiers 277, 279, 281, and 283. Unlike the diodes 168, 170, 172, and 174, the synchronous rectifiers 277, 279, 281, and 283 may be configured to maintain a constant or nearly constant output voltage regardless of the output current.

Figure 4:
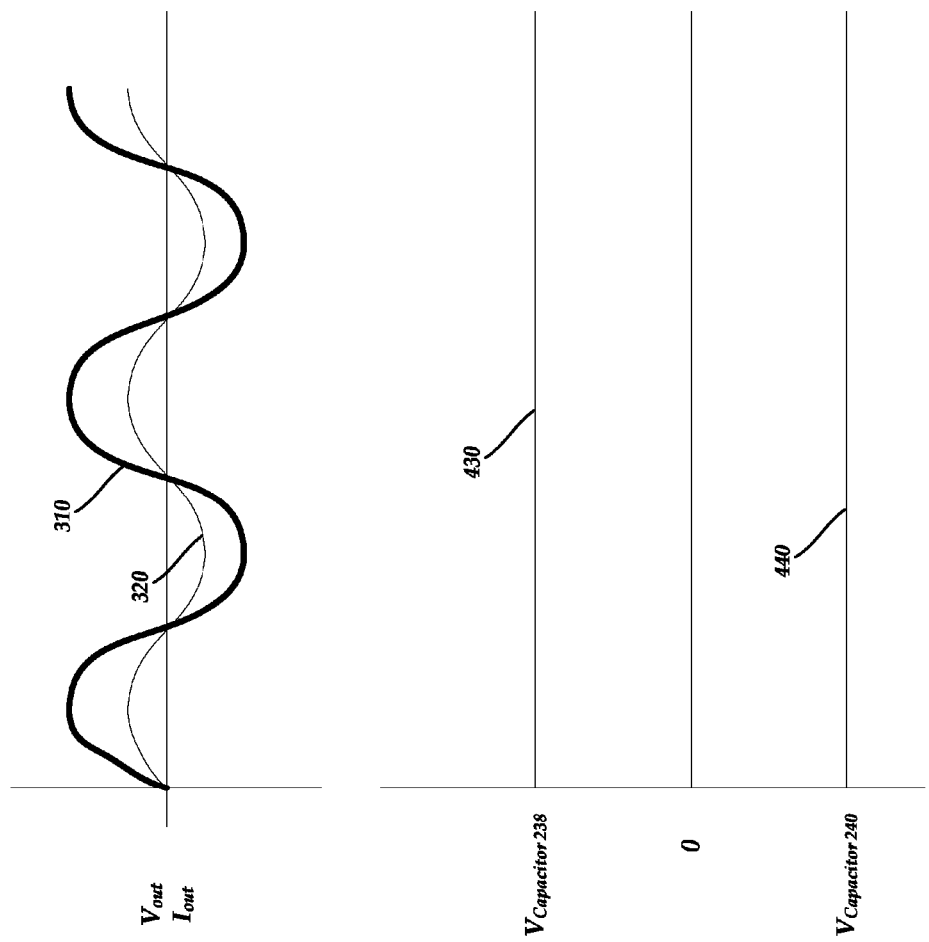
FIG. 4 illustrates example graphs depicting the reduction in the off side charging problem in the supply voltage circuit of FIG. 2A.

FIG. 4 illustrates example graphs depicting the reduction in the off side charging problem in the supply voltage circuit 200 of FIG. 2A. As illustrated in FIG. 4, the amplitude 310 of the output voltage of the supply voltage circuit 100 (e.g., V+ or V−) and the amplitude 320 of the output current of the supply voltage circuit 100 oscillate as described above with respect to FIG. 3. As the output voltage and the output current oscillate, amplitude 330 remains constant or nearly constant, even when the supply voltage rail corresponding to V+ is unloaded (e.g., $V_{out}$ has a negative amplitude). Likewise, amplitude 340 remains constant or nearly constant, even when the supply voltage rail corresponding to V− is unloaded (e.g., $V_{out}$ has a positive amplitude).

Because the synchronous rectifiers 277, 279, 281, and 283 maintain a constant or nearly constant output voltage regardless of the output current, the capacitors 238 and 240 may not be required to have large capacitance values. Thus, large electrolytic capacitors with short lifetime ratings can be replaced with small ceramic capacitors with much greater lifetime ratings. Furthermore, the power supply circuit 200 may not include a regulation scheme. Thus, the outputs V+ and V− may track +BUS and −BUS, respectively, as scaled by the power transformer of windings 250, 252, and 254.

Optionally, the cross regulation and off side charging improvement scheme described above can be expanded for any number of outputs. For example, to account for additional outputs, secondary windings can be added to the power transformer and/or the transformer 220, transistors and/or synchronous rectifiers can be added to the power supply circuit 200, and output capacitors can be added to the power supply circuit 200. The number of added secondary windings may be the same as the number of added transistors and synchronous rectifiers (e.g., each new secondary winding of the transformer 220 may be associated with and coupled to a new transistor or synchronous rectifier). The number of added output capacitors may correspond to the number of added outputs. Such an expansion of the scheme may be useful for powering separate amplifiers of different voltage capability (e.g., multiple Class D amplifiers) or for having multiple supply voltage rails as in a Class G or Class H system.

Eliminating External Resonant Inductor

In the topology of the supply voltage circuit 100, the total leakage inductance as seen by the primary side of the power transformer varies depending on the loading. For example, total leakage inductance as seen by the winding 150 may be the inductance represented by inductor 156 or the inductance represented by inductor 158 when only one secondary winding (e.g., winding 152 or 154) is conducting at a given time. One secondary winding may be conducting in the case of low frequency loading. As another example, total leakage inductance as seen by the winding 150 may be the parallel combination of the inductance represented by inductor 156 and the inductance represented by inductor 158 when both secondary windings (e.g., windings 152 and 154) are conducting simultaneously. Both secondary windings may be conducting simultaneously in the case of high frequency loading. Thus, the total leakage inductance can vary by a factor of two (or other such factors), which can result in unacceptably large changes in the resonant period for a fixed frequency converter like the supply voltage circuit 100 or the supply voltage circuit 200.

To reduce the variation in the total inductance seen by the winding 150, the inductor 148, the external resonant inductor, can be added to the topology of the supply voltage circuit 100. However, even with the inductor 148 included in the topology of a supply voltage circuit, the change in the resonant frequency caused by the change in total leakage inductance can cause (1) too long of a period, resulting in hard switching; or (2) too short of a period, resulting in high peak currents.

Figure 5:
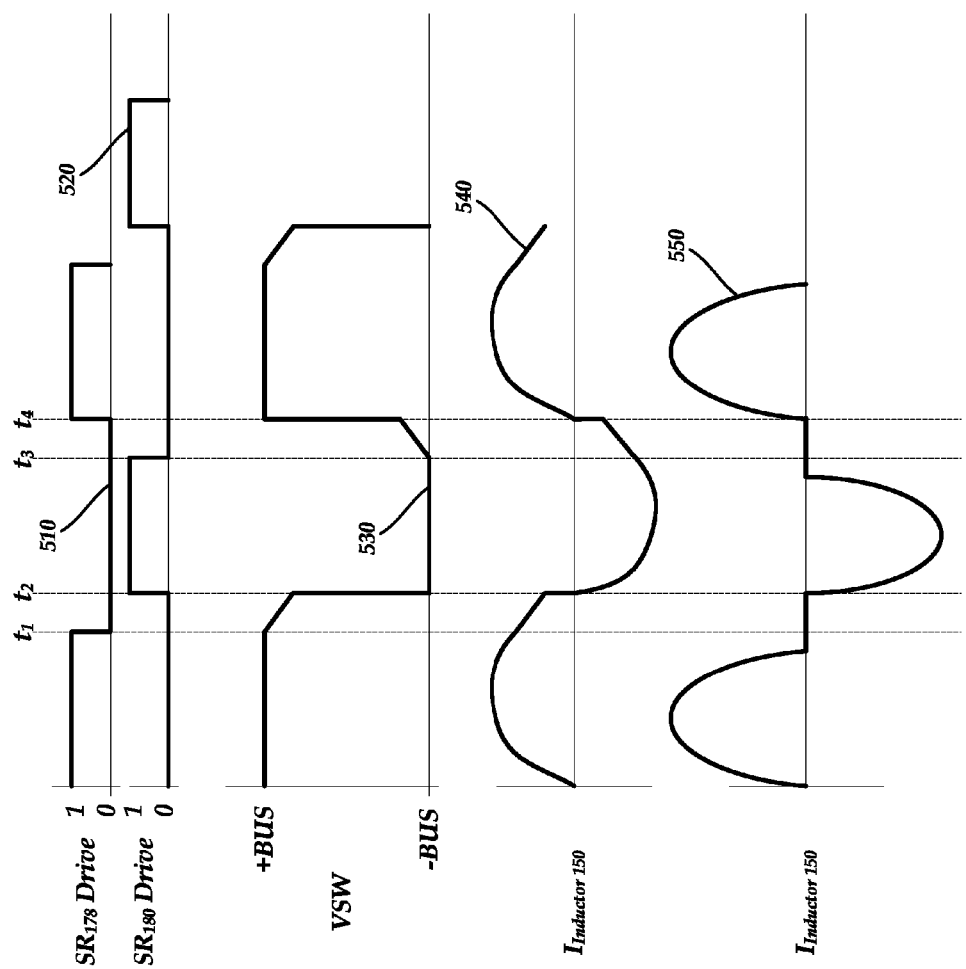
FIG. 5 illustrates example waveforms derived from operation of the supply voltage circuit of FIG. 1A.

FIG. 5 illustrates example waveforms 510, 520, 530, 540, and 550 derived from operation of the supply voltage circuit 100 of FIG. 1A. As illustrated in FIG. 5, the transistors 178 and 180 are alternately driven, as depicted by waveform 510 (for the transistor 178) and waveform 520 (for the transistor 180). A first time the transistor 178 transitions from being driven to not being driven corresponds to time $t_1$. A first time the transistor 180 transitions from not being driven to being driven corresponds to time $t_2$. A first time the transistor 180 transitions from being driven to not being driven corresponds to time $t_3$. A first time the transistor 178 transitions from not being driven to being driven corresponds to time $t_4$.

Ideally, the voltage at node VSW transitions from the voltage at +BUS to the voltage at −BUS and vice-versa. However, as depicted by the waveform 530, the magnitude of the voltage at node VSW begins to sag or fall during the brief periods of time when neither the transistor 178 nor the transistor 180 is being driven (e.g., between time $t_1$ and $t_2$ and between $t_3$ and $t_4$).

In addition, ideally the current passing through the winding 150 follows the same pattern regardless of the loading conditions. However, the current passing through winding 150 can vary depending on the loading conditions in the topology of the supply voltage circuit. The waveform 540 depicts the current passing through the winding 150 when either the winding 152 or the winding 154 is conducting. The waveform 550 depicts the current passing through the winding 150 when both the windings 152 and 154 are conducting. As illustrated in FIG. 5, the waveforms 540 and 550 are different.

Accordingly, the supply voltage circuit 200 is designed such that the windings 252 and 254 are always effectively in place (e.g., because the synchronous rectifiers 277, 279, 281, and/or 283 couple the inductances of the windings 252 and 254 to the output capacitors 238 and/or 240 even when the diodes 268, 270, 272, and/or 274 are turned off), which results in a constant leakage inductance as seen by the primary side of the power transformer (e.g., the winding 250). Thus, it may not be necessary to include the external resonant inductor in the topology of the supply voltage circuit 200. Because the leakage inductance remains constant in the topology of the supply voltage circuit 200, the resonant frequency remains constant. With resonant frequency constant, the primary current waveforms (e.g., the current passing through the winding 250) can have optimal or near optimal soft switching and peak currents, regardless of the loading condition. Elimination of the external resonant inductor also may reduce or eliminate the core losses and/or the copper losses associated with the external resonant inductor. In addition, the supply voltage circuit 200 can be designed to be smaller in size, weight, and/or cost without the inclusion of the external resonant inductor in the circuit topology.

Figure 6:
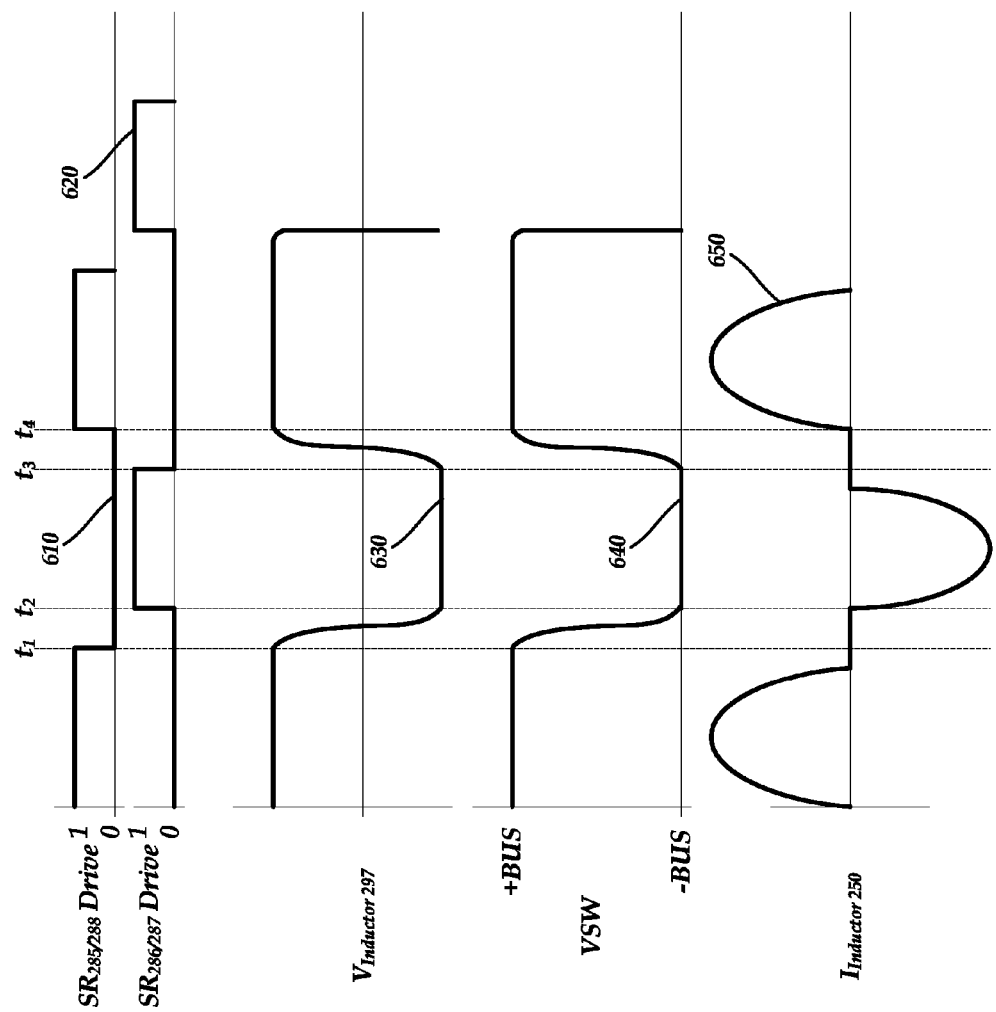
FIG. 6 illustrates example waveforms derived from operation of the supply voltage circuit of FIGS. 2A-2C.

FIG. 6 illustrates example waveforms 610, 620, 630, 640, and 650 derived from operation of the supply voltage circuit 200 of FIGS. 2A-2C. As illustrated in FIG. 6, the transistors 285 and 288 and the transistors 286 and 287 are alternately driven, as depicted by waveform 610 (for the transistors 285 and 288) and waveform 620 (for the transistors 286 and 287). A first time the transistors 285 and 288 transition from being driven to not being driven corresponds to time $t_1$. A first time the transistors 286 and 287 transition from not being driven to being driven corresponds to time $t_2$. A first time the transistors 286 and 287 transition from being driven to not being driven corresponds to time $t_3$. A first time the transistors 285 and 288 transition from not being driven to being driven corresponds to time $t_4$.

As depicted by the waveform 630, the voltage across the inductor 297 (e.g., the primary side of the transformer 220) smoothly transitions, without significant voltage lag, from a high value to a low value when the transistors 286 and 287 are driven (e.g., at time $t_2$) and smoothly transitions, without significant voltage lag, from a low value to a high value when the transistors 285 and 288 are driven (e.g., at time $t_4$). Similarly, the voltage at node VSW, as depicted by the waveform 640, does not exhibit the degree of voltage sag as depicted by the waveform 530.

Finally, the voltage across the winding 250 follows the same pattern regardless of the loading conditions, as depicted by the waveform 650. For example, the voltage across the winding 250 may track the waveform 650 regardless of whether the windings 252 and 254 are individually or collectively conducting.

Using Magnetizing Inductance for Soft Switching Under Idle Conditions

Inductors 248 and 296 may represent magnetizing inductance. The sizing of inductor 248 and of inductor 296 may be important to avoid lossy switching and/or to reduce conduction losses. For example, if the inductor 248 is sized incorrectly, when the transistor 278 turns off at time $t_1$ under idle conditions, insufficient energy may be stored in the inductor 248 to swing the parasitic capacitances represented by capacitors 232 and 234. Thus, the voltage at node VSW may remain unchanged or nearly unchanged until time $t_2$ when the transistor 280 is turned on. Similarly, if the inductor 248 is sized incorrectly, when the transistor 280 turns off at time $t_3$ under idle conditions, insufficient energy may be stored in the inductor 248 to swing the parasitic capacitances represented by capacitors 232 and 245. Thus the voltage at node VSW may remain unchanged or nearly unchanged until time $t_4$ when the transistor 278 is turned on. This can result in the transistor 280 discharging and/or dissipating some or all of the energy stored in the capacitor 234 at time $t_2$ and the transistor 278 discharging and/or dissipating some or all of the energy stored in the capacitor 232 at time $t_4$.

An incorrectly sized inductor 296 of the transformer 220 may result in similar problems. For example, not enough energy may be stored in the inductor 296 when transistors 285-288 turn on and off to swing the capacitances represented by capacitors 289 and 292-294. Thus, the transistors 285-288 may discharge and/or dissipate some or all of the energy stored in the capacitors 289 and 292-294.

Accordingly, an inductance value for the inductor 248 can be selected such that sufficient magnetizing current is present to resonantly swing capacitors 225, 227, 229, 231, 232, and 234 between time $t_1$ and $t_2$ and between time $t_3$ and $t_4$. Similarly, an inductance value for the inductor 296 can be selected such that sufficient magnetizing current is present to resonantly swing capacitors 289 and 292-294 between time $t_1$ and $t_2$ and between time $t_3$ and $t_4$. If either inductor 248 or inductor 296 has too large of an inductance, lossy switching may occur. If either inductor 248 or inductor 296 has too small of an inductance, then conduction losses may increase.

Reducing Switching Loss Under Quiescent Conditions

As described above, the PFC controls circuit 110 of the supply voltage circuit 100 includes the comparator 184 that forces PFC current through the resistor 144 to reproduce the waveform generated by the current source 182. This can result in the transistor 176 continuously switching between −BUS and +BUS.

Figure 7:
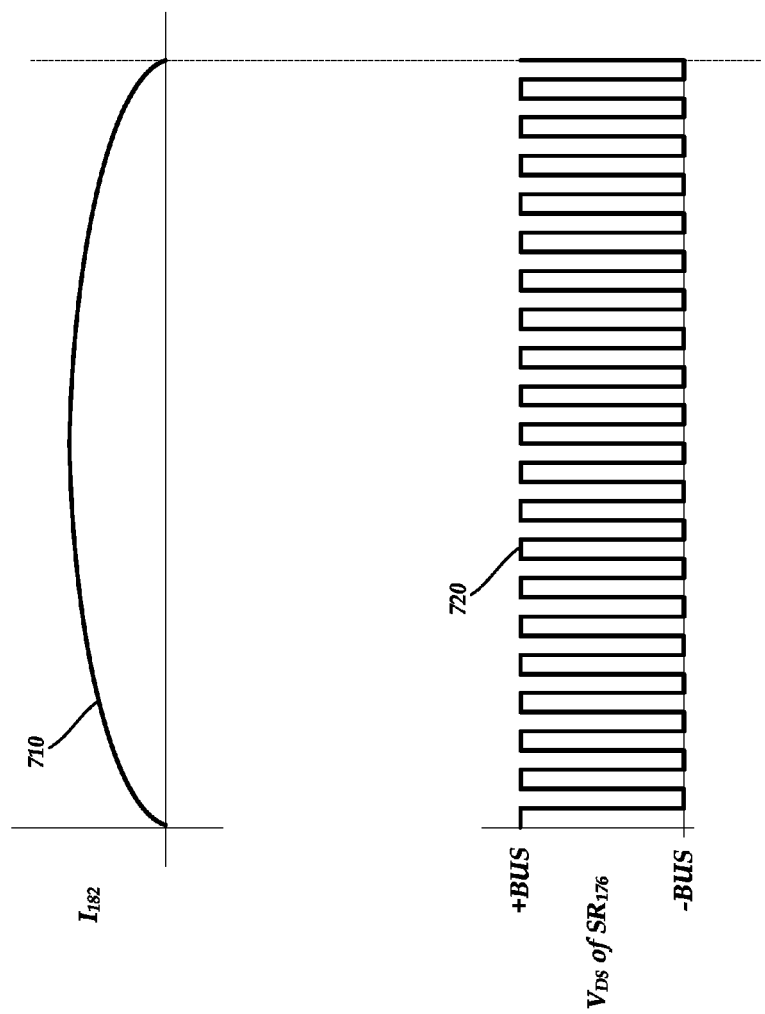
FIG. 7 illustrates examples waveforms generated based on the PFC controls circuit of FIG. 1B.

FIG. 7 illustrates examples waveforms 710 and 720 generated based on the PFC controls circuit 110 of FIG. 1B. As illustrated in FIG. 7, a current generated by the current source 182 is represented by the waveform 710. During the time that the generated current is a positive value, the voltage across the transistor 176 (e.g., $V_{DS}$) is continuously switching between −BUS and +BUS. The continuous switching can be problematic because it can result in hard switching over the entire period that the current generated by the current source 182 is positive. The hard switching can cause energy loss via capacitors 124 and/or 128.

Accordingly, the PFC controls circuit 210 of the supply voltage circuit 200 includes the current source 299 to provide a current offset. For example, the current source 299 and the resistor 243 may collectively shift the sine wave generated by the current source 282 downward so that the current is negative or nearly negative near the zero crossing.

Figure 8:
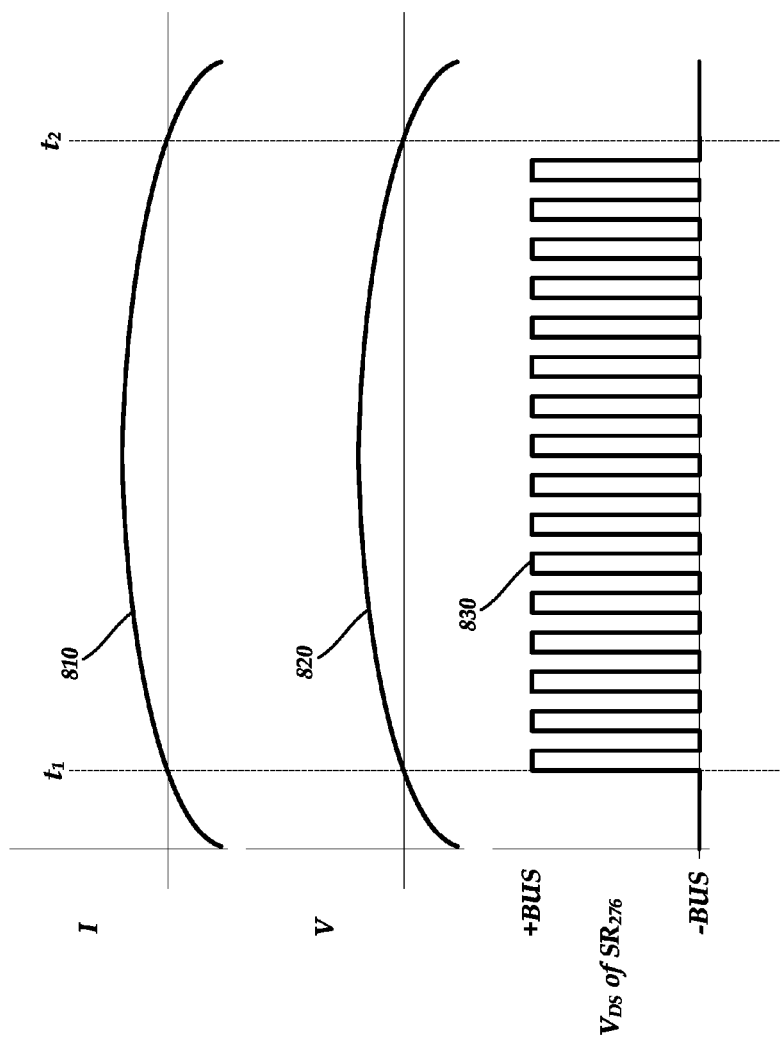
FIG. 8 illustrates examples waveforms generated based on the PFC controls circuit of FIG. 2B.

FIG. 8 illustrates examples waveforms 810, 820, and 830 generated based on the PFC controls circuit 210 of FIG. 2B. As depicted by the waveform 810 in FIG. 8, the current, after being offset based on the current source 299, is negative for a period of time (e.g., before time $t_1$ and after time $t_2$). Likewise, as depicted by the waveform 820 in FIG. 8, the voltage, which can be calculated based on the current generated by the current source 282, the current generated by the current source 299, the resistor 242, and the resistor 243 (e.g., $(I_{282}*R_{242})-(I_{299}*R_{243})$), is negative for a period of time (e.g., before time $t_1$ and after time $t_2$).

Because the PFC current cannot be negative, the switching of the transistor 276 is stopped near the zero crossing (e.g., before time $t_1$ and after time $t_2$). Thus, the period of time that the transistor 276 is switching is reduced. Therefore, the switching of the capacitors 224 and 228 is not occurring before time $t_1$ and after $t_2$, causing a reduction in energy loss. As loads increase, the control loop of the PFC controls circuit 210 can increase the magnitude of the current generated by the current source 282 and the power factor is then perfect or nearly perfect (e.g., 0.9, 0.95, etc.).

Reducing Hard Switching Loss Under Quiescent Conditions

In the supply voltage circuit 100 topology, the inductor 146 is a PFC choke. Conventional PFC chokes are designed for low core losses and/or copper losses under full power conditions. To optimize total losses of the PFC stage (e.g., the capacitors 124, 126, and 128, the inductor 146, the diodes 160 and 162, and the transistor 176), the inductor 146 capacitance is generally reduced because the inductor 146 is discharged by the transistor 176 even under quiescent conditions. For example, the inductor 146 may include one winding on a powder core to minimize core and/or copper losses.

However, a modified PFC choke can result in a greater reduction of core and/or copper losses. For example, in the supply voltage circuit 200 topology, the inductor 246 is a modified PFC choke.

Figure 9:
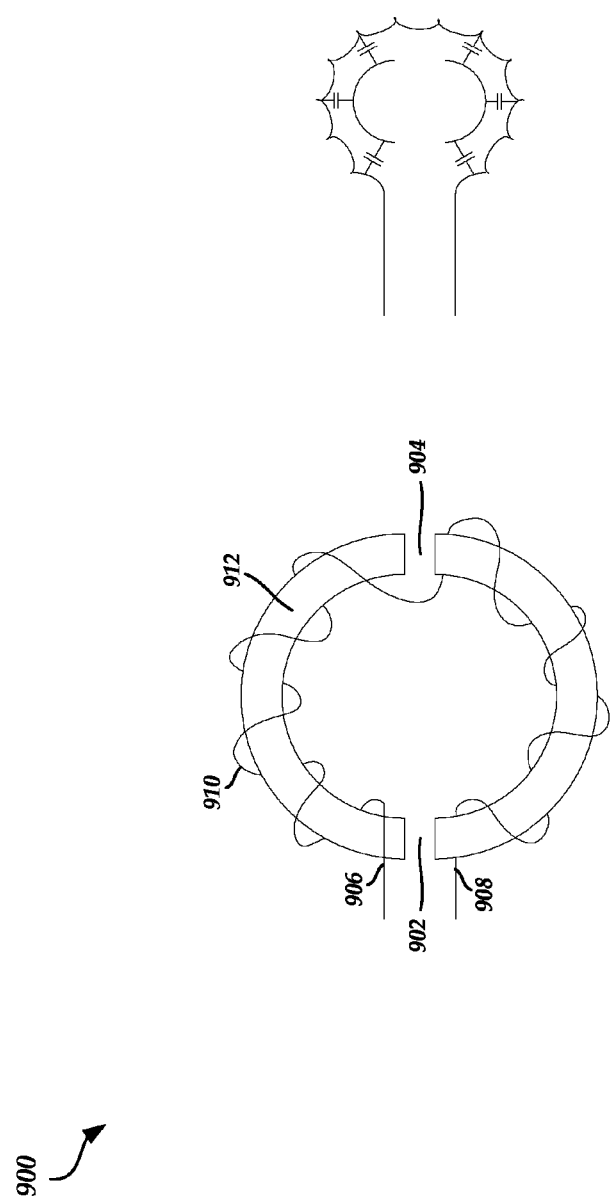
FIG. 9 illustrates an example modified PFC choke.

FIG. 9 illustrates an example modified PFC choke 900. As illustrated in FIG. 9, the PFC choke 900 can be constructed of a ferrite toroid 912. The PFC choke 900 core can include a first portion and a second portion separated by gaps 902 and 904. The PFC choke 900 can further include one winding 910. The ferrite toroid 912 may be selected because it can result in lower core losses than a powder core. The two gaps 902 and 904 can be used to partially or completely cancel stray magnetic fields. The two gaps 902 and 904 result in an insulating gap between a start of the winding at 906 and an end of the winding at 908, which can further reduce capacitance because the start 906 and the end 908 are capacitively tied to separate core halves of the PFC choke 900. The reduction in capacitance can reduce hard switching losses in the transistor 276.

In addition, the winding 910 may be insulated to reduce turn-to-turn capacitance. The core of the PFC choke 900 may further be insulated with tape to reduce winding-to-core losses.

As described herein, the supply voltage circuit 200 is modified from conventional supply voltage circuits to provide several benefits. While the supply voltage circuit 200 topology is illustrated as implementing many of the improvements described herein, this is not meant to be limiting as some, but not all, of the improvements can be implemented to improve the performance of the supply voltage circuit and/or the Class D amplifier. For example, the supply voltage circuit 200, among other things, (1) uses synchronous rectifiers (e.g., synchronous rectifiers 277, 279, 281, and 283) instead of diodes (e.g., diodes 168, 170, 172, and 174) to improve cross regulation and/or off side charging; (2) removes the external resonant inductor from the topology; (3) introduces and includes appropriate values for inductors 248 and 296; (4) uses a modified PFC controls circuit 210; and (5) uses a modified PFC choke for inductor 246. Together, improvements (1), (2), (3), (4), (5), and/or any other improvements described herein may result in a reduction of the quiescent power to levels low enough such that a standby power mode may not be needed to comply with the relevant standards (e.g., a reduction in the quiescent power from 12.1 W to 8.4 W). However, any combination of improvements (1), (2), (3), (4), and/or (5) can be implemented in the topology of the supply voltage circuit 200 to achieve a reduction in the quiescent power and/or the other benefits described herein.

Reducing Losses in the Isolation Stage at Light Loads

Figure 10:
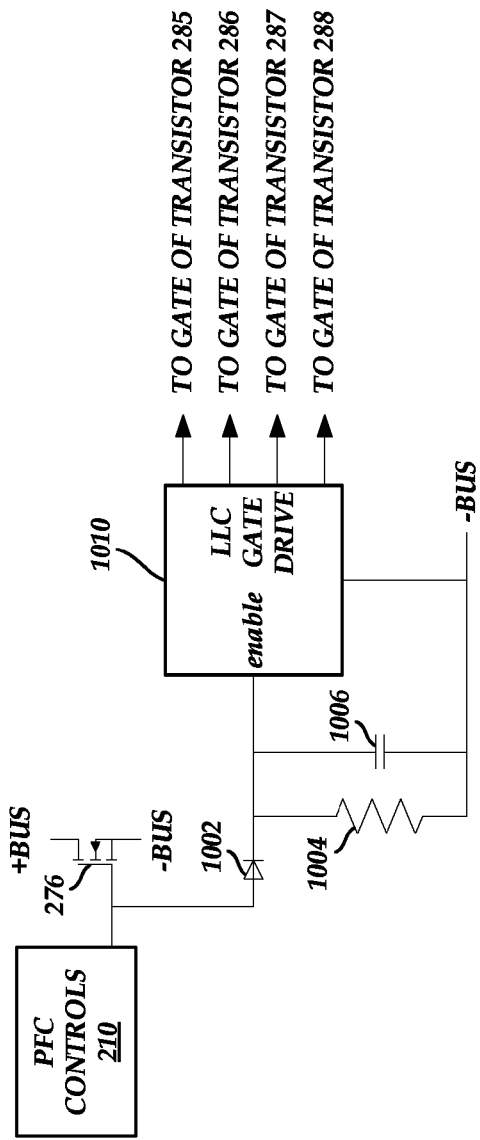
FIG. 10 illustrates a circuit for driving the gates of the transistors 285-288 of the transformer 220 of FIG. 2C.

FIG. 10 illustrates a circuit for driving the gates of the transistors 285-288 of the transformer 220 of FIG. 2C. The gate drive signal generated and transmitted by the PFC controls circuit 210 to the transistor 276 can be envelope detected and used to enable and/or disable the gate drive signals in the transformer 220 (e.g., the gate drive signals used to drive the transistors 285-288), as shown in FIG. 10. This can result in disabling switching during a fraction of the line cycle, saving switching losses and/or core losses. The frequency of the enabling and/or disabling of the gate drive signals can result in line frequency ripple, which is desirable as opposed to a frequency anywhere else in the audio band.

For example, the output of the PFC controls circuit 210 and the gate of the transistor 276 may be coupled to one end of diode 1002. The other end of the diode 1002 may be coupled to an enable input of a gate driver 1010, one end of resistor 1004, and one end of capacitor 1006, where the resistor 1004 and the capacitor 1006 are coupled in parallel. The other ends of the resistor 1004 and the capacitor 1006 may be coupled to the node −BUS. When the value at the enable input of the gate driver 1010 is high, the gate driver 1010 may transmit an enable signal to one or more of the gates of the transistors 285-288. Likewise, when the enable input of the gate driver 1010 is low, the gate driver 1010 may transmit a disable signal to one or more of the gates of the transistors 285-288.

Example Process Flow

Figure 11:
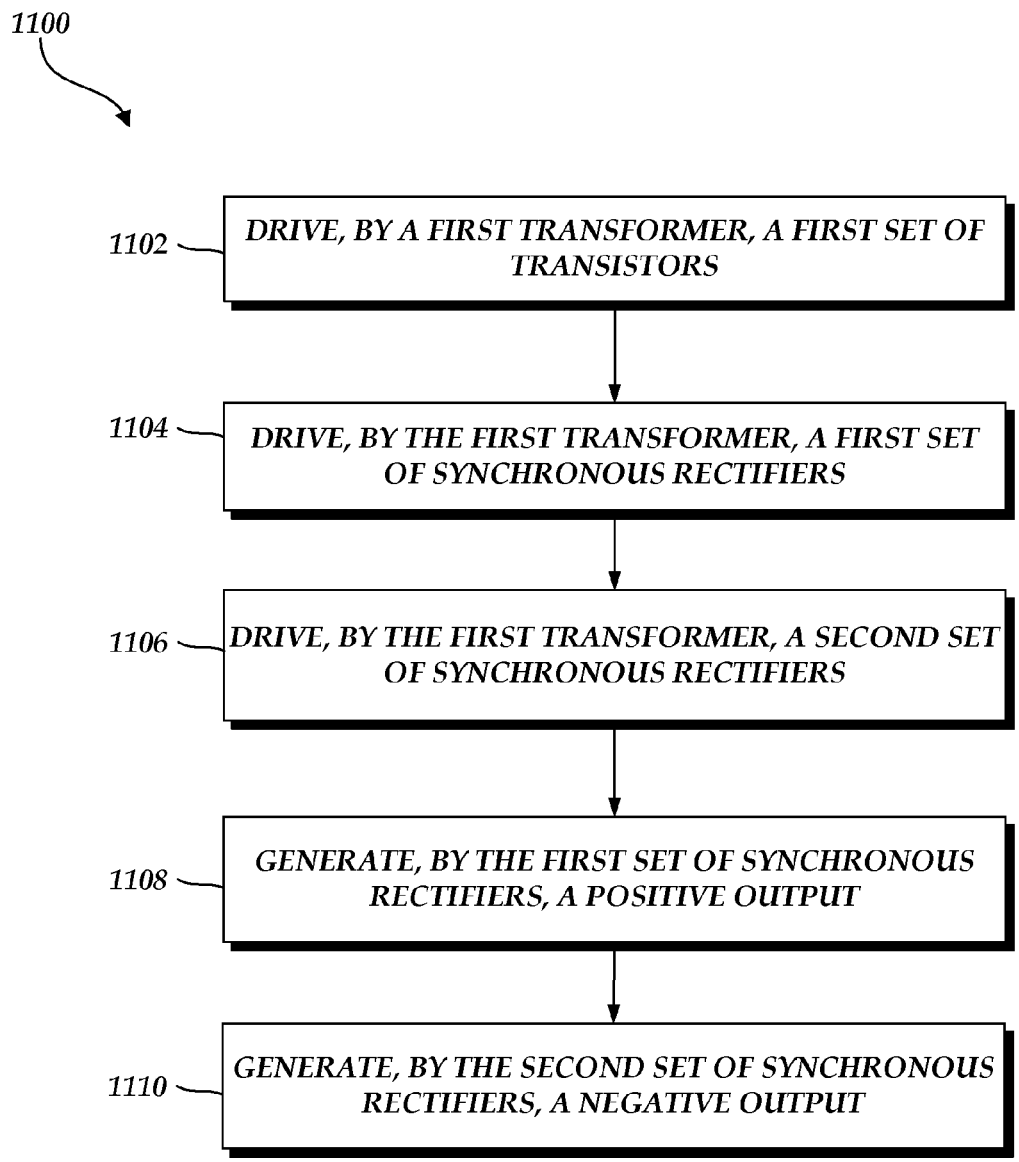
FIG. 11 is a flowchart depicting an illustrative operation of improving cross regulation and/or off side charging in a power supply.

FIG. 11 is a flowchart 1100 depicting an illustrative operation of improving cross regulation and/or off side charging in a power supply. Depending on the embodiment, the method of FIG. 11 may include fewer and/or additional blocks and the blocks may be performed in an order different than illustrated. The process may optionally be implemented using one or more of the circuit topologies discussed herein.

In block 1102, a first set of transistors is driven by a first transformer. Optionally, a second transformer includes a primary side and a secondary side and the first set of transistors is coupled to the primary side.

In block 1104, a first set of synchronous rectifiers is driven by the first transformer. Optionally, the first set of synchronous rectifiers is coupled to the secondary side and a positive output of a power supply.

In block 1106, a second set of synchronous rectifiers is driven by the first transformer. Optionally the second set of synchronous rectifiers is coupled to the secondary side and a negative output of the power supply.

In block 1108, a positive output is generated by the first set of synchronous rectifiers. In block 1110, a negative output is generated by the second set of synchronous rectifiers. Together, the first set of synchronous rectifiers and the second set of synchronous rectifiers can maintain constant output voltage, thereby improving cross regulation and/or off side charging.

Terminology

The various features and processes described above may be used independently of one another, or may be combined in various ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

It should be emphasized that many variations and modifications may be made to the above-described embodiments, the elements of which are to be understood as being among other acceptable examples. All such modifications and variations are intended to be included herein within the scope of this disclosure. The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. An apparatus comprising:
    a positive output;
    a negative output;
    a first transformer comprising a first primary side and a first secondary side, wherein the first primary side comprises a first set of transistors and a first inductor coupled to the first set of transistors, and wherein the first inductor produces a magnetized inductance;
    a second transformer comprising a second primary side and a second secondary side;
    a second set of transistors coupled to the second primary side of the second transformer, wherein the first transformer is configured to drive the second set of transistors;
    a first set of synchronous rectifiers coupled to the second secondary side of the second transformer, wherein the first set of synchronous rectifiers are further coupled to the positive output, and wherein the first transformer is further configured to drive the first set of synchronous rectifiers; and
    a second set of synchronous rectifiers coupled to the second secondary side of the second transformer, wherein the second set of synchronous rectifiers are further coupled to the negative output and the first set of synchronous rectifiers, and wherein the first transformer is further configured to drive the second set of synchronous rectifiers.

2. The apparatus of claim 1, wherein the first secondary side comprises a first set of inductors, a second set of inductors, and a third set of inductors, wherein the first set of inductors are coupled to the second set of transistors, wherein the second set of inductors are coupled to the first set of synchronous rectifiers, and wherein the third set of inductors are coupled to the second set of synchronous rectifiers.

3. The apparatus of claim 1, wherein the second primary side of the second transformer comprises a second inductor that produces a magnetized inductance.

4. The apparatus of claim 1, wherein the first set of synchronous rectifiers are configured to reduce an off side charging of a supply voltage rail corresponding to the positive output from a first level to a second level lower than the first level.

5. The apparatus of claim 1, wherein the second set of synchronous rectifiers are configured to reduce an off side charging of a supply voltage rail corresponding to the negative output from a first level to a second level lower than the first level.

6. The apparatus of claim 1, wherein the first set of synchronous rectifiers comprises a first synchronous rectifier and a second synchronous rectifier, wherein a drain of the first synchronous rectifier and a drain of the second synchronous rectifier are coupled to the positive output.

7. The apparatus of claim 6, wherein the second set of synchronous rectifiers comprises a third synchronous rectifier and a fourth synchronous rectifier, wherein a source of the third synchronous rectifier and a source of the fourth synchronous rectifier are coupled to the negative output, wherein a drain of the third synchronous rectifier is coupled to a source of the first synchronous rectifier, and wherein a drain of the fourth synchronous rectifier is coupled to a source of the second synchronous rectifier.

8. The apparatus of claim 1, further comprising:
a power factor correction (PFC) controls circuit; and
a PFC stage coupled to the PFC controls circuit, wherein the PFC stage is further coupled to the second set of transistors.

9. The apparatus of claim 8, wherein the PFC controls circuit comprises a current source configured to generate a current and a second current source configured to reduce an amplitude of the current generated by the current source to reduce a period of time during which a transistor in the PFC stage is switching between a first voltage and a second voltage.

10. The apparatus of claim 8, wherein the PFC stage comprises a PFC choke, wherein the PFC choke comprises a core with a first portion and a second portion separated from the first portion by a gap.

11. The apparatus of claim 10, wherein the core comprises a ferrite toroid.

12. The apparatus of claim 1, wherein the apparatus comprises a power supply for a Class D amplifier.

13. The apparatus of claim 1, wherein the apparatus is configured to reduce a quiescent power level from 12.1 W to 8.4 W.

14. A method comprising:
driving, by a first transformer, a first set of transistors, wherein a second transformer comprises a primary side and a secondary side, wherein the first set of transistors is coupled to the primary side, wherein the first transformer comprises a second primary side and a second secondary side, wherein the second primary side comprises a second set of transistors and a first inductor coupled to the second set of transistors, and wherein the first inductor produces a magnetized inductance;
driving, by the first transformer, a first set of synchronous rectifiers, wherein the first set of synchronous rectifiers is coupled to the secondary side;
driving, by the first transformer, a second set of synchronous rectifiers, wherein the second set of synchronous rectifiers is coupled to the secondary side;
generating, by the first set of synchronous rectifiers, a positive output; and
generating, by the second set of synchronous rectifiers, a negative output.

15. The method of claim 14, wherein the second secondary side comprises a first set of inductors, a second set of inductors, and a third set of inductors, wherein the first set of inductors are coupled to the first set of transistors, wherein the second set of inductors are coupled to the first set of synchronous rectifiers, and wherein the third set of inductors are coupled to the second set of synchronous rectifiers.

16. The method of claim 14, further comprising reducing, by the first set of synchronous rectifiers, an off side charging of a supply voltage rail corresponding to the positive output from a first level to a second level lower than the first level.

17. The method of claim 14, wherein the positive output comprises a positive output of a power supply for a Class D amplifier.

18. The method of claim 14, wherein generating a positive output and generating a negative output further comprises reducing a quiescent power level from 12.1 W to 8.4 W.

* * * * *